(12) United States Patent
Hsu et al.

(10) Patent No.: US 7,387,907 B2
(45) Date of Patent: Jun. 17, 2008

(54) IMAGE SENSOR WITH OPTICAL GUARD RING AND FABRICATION METHOD THEREOF

(75) Inventors: Tzu-Hsuan Hsu, Kaohsiung (TW); Dun-Nian Yaung, Taipei (TW); Yean-Kuen Fang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 28 days.

(21) Appl. No.: 11/517,296

(22) Filed: Sep. 8, 2006

(65) Prior Publication Data

US 2007/0020791 A1    Jan. 25, 2007

Related U.S. Application Data

(62) Division of application No. 10/868,827, filed on Jun. 17, 2004, now Pat. No. 7,122,840.

(51) Int. Cl.
*H01L 21/00*    (2006.01)
(52) U.S. Cl. .......................... 438/59; 438/430
(58) Field of Classification Search ............. 257/80, 257/84, 435, 508, 659; 438/24, 430, 57, 438/59, 22
See application file for complete search history.

(56) References Cited

U.S. PATENT DOCUMENTS

| 4,216,486 | A | * | 8/1980 | Geddes | ........................ 327/514 |
| 5,371,384 | A | * | 12/1994 | Wada | ........................ 257/82 |
| 6,130,422 | A | | 10/2000 | Bawolek et al. | |
| 6,194,258 | B1 | | 2/2001 | Wuu | |
| 6,261,894 | B1 | | 7/2001 | Mandelman et al. | |
| 6,482,669 | B1 | | 11/2002 | Fan et al. | |
| 6,620,703 | B2 | | 9/2003 | Kunikiyo et al. | |
| 6,696,349 | B2 | | 2/2004 | Vollrath et al. | |
| 6,812,122 | B2 | | 11/2004 | Bertin et al. | |
| 6,964,897 | B2 | | 11/2005 | Bard et al. | |
| 6,967,316 | B2 | | 11/2005 | Lee et al. | |
| 7,015,085 | B2 | | 3/2006 | Ahmed et al. | |
| 7,122,840 | B2 | * | 10/2006 | Hsu et al. | ..................... 257/80 |
| 2001/0023949 | A1 | | 9/2001 | Johnson et al. | |
| 2004/0002177 | A1 | | 1/2004 | Lin et al. | |
| 2004/0188771 | A1 | | 9/2004 | Yaung et al. | |
| 2004/0227061 | A1 | | 11/2004 | Clevenger et al. | |
| 2005/0017316 | A1 | | 1/2005 | Yaung | |
| 2005/0263804 | A1 | | 12/2005 | Yoshihara | |
| 2005/0263805 | A1 | | 12/2005 | Mouli | |

* cited by examiner

*Primary Examiner*—Mark Prenty
(74) *Attorney, Agent, or Firm*—Birch, Stewart, Kolasch & Birch, LLP

(57) ABSTRACT

An image sensor device and fabrication method thereof wherein a substrate having at least one shallow trench isolation structure therein is provided. At least one photosensor and at least one light emitting element, e.g., such as MOS or LED, are formed in the substrate. The photosensor and the light emitting element are isolated by the shallow trench isolation structure. An opening is formed in the shallow trench isolation structure to expose part of the substrate. An opaque shield is formed in the opening to prevent photons from the light emitting element from striking the photosensor.

11 Claims, 10 Drawing Sheets

IMAGE SENSOR WITH OPTICAL GUARD RING AND FABRICATION METHOD THEREOF

This application is a Divisional of U.S. Pat. No. 7,122,840 which issued from application Ser. No. 10/868,827, filed on Jun. 17, 2004, the entire contents of which are hereby incorporated by reference and for which priority is claimed under 35 U.S.C. § 120.

BACKGROUND OF THE INVENTION

1. Field of the Invention

The present invention relates to an image sensor device and fabrication method thereof, and more particularly, to a method of forming optical guard rings for an image sensor device to eliminate interference between photodiode and adjacent light emitting structures.

2. Description of the Related Art

Light imaging array devices are used in a wide variety of applications in the background art. These devices utilize an array of active pixels or image sensor cells. The image sensor cells usually include active image sensing elements, such as photodiodes, in addition to adjacent transistor structures, such as transfer gate structures, and reset transistors. These transistors, as well as additional devices used for control and signal circuits in the peripheral regions of the image sensor cell, or for peripheral logic circuits, include complimentary metal oxide semiconductor (CMOS) devices.

FIGS. 1A-1C are sectional views showing a portion of a semiconductor substrate, schematically illustrating a fabrication process for an image sensor device of the background art. A p-type semiconductor substrate 1 is provided. By performing ion implantation of boron, a p-well region 2 is formed in a top portion of the semiconductor substrate 1, and the concentration of p-type dopant in the p-well region 2 exceeds that in the semiconductor substrate 1. A shallow trench isolation (STI) structure 3 is then formed in a portion of the semiconductor substrate 1 to isolate the photodiode element and the transistor structure formed in subsequent steps.

In FIG. 1B, a gate insulating layer 4, e.g., such as $SiO_2$, is defined on part of the semiconductor substrate 1. A gate structure 5, e.g., such as doped polysilicon, is then defined after deposition and etching. In FIG. 1C, n-type lightly doped drain (LDD) regions 6 are formed in areas of the p-well region 2 not covered by the gate structure 5. Spacers 7, such as SiN, are formed on the sides of the gate structure 5. Using the spacers 7 and the gate structure 5 as a mask, n-type heavily doped source/drain regions 8 and 9 are then formed in areas of p-well region 2 by ion implantation. An NMOS element 10 functioning as a transfer gate transistor or a reset transistor is thus obtained. This ion implantation procedure also results in the formation of photodiode element 12 in image sensor cell region. The photodiode element 12 consists of an n-type heavily doped region 11 in the p-well region 2.

FIG. 2 shows the problem of photons induced by the NMOS element 10, degrading sensor performance. For example, when the NMOS element 10 is in an ON state, unexpected photon (or light) emission 20 can be generated by hot carrier effect. The photons (or light) emission 20 can penetrate the STI structure 3 and strike the photodiode element 12, thereby causing noise and crosstalk, and seriously degrading the performance of the device.

U.S. Pat. No. 6,130,422 to Edward et al., the entirety of which is hereby incorporated by reference, describes a method to improve the quantum efficiency (QE) of an image sensor. The image sensor includes a photodiode and a dielectric structure. The photodiode is responsive to an amount of incident light from a light source. The dielectric structure is on top of the photodiode and between the photodiode and an interlevel dielectric (ILD) oxide layer. The dielectric structure includes a nitride material. The ILD oxide layer is made of an oxide material and has an ILD oxide thickness.

U.S. Pat. No. 6,482,669 to Fan et al., the entirety of which is hereby incorporated by reference, describes a method of improving the light collection efficiency of an image sensor. A high transmittance overcoat layer with a flat top surface is formed upon the color filter, wherein the refractive index of the overcoat layer approximates that of the color filter.

U.S. Pat. No. 6,194,258 to Wuu, the entirety of which is hereby incorporated by reference, describes a method of forming an image sensor cell and a CMOS logic circuit device. This method features the selective formation of a thin silicon oxide layer on the top surface of the photodiode element, in the image sensor cell region of a semiconductor chip. The thin silicon oxide layer prevents formation of metal silicide on the photodiode element during formation of the desired metal silicide layer on the CMOS logic devices. This allows low, dark current generation and a high signal to noise ratio.

However, the present inventors have determined that the aforementioned methods of the background art suffer from several disadvantages. For example, none of the cited methods provide shielding from light emitted from the MOS structure in the image sensor.

SUMMARY OF THE INVENTION

The present invention overcomes the shortcomings associated with the background art and achieves other advantages not realized by the background art.

An object of the present invention is to provide an image sensor device and fabrication method thereof, providing a solution to the light emission problems present in the conventional methodology.

An object of the present invention is to provide a method of forming an image sensor device having optical guard rings with a shallow trench isolation (STI) process.

One or more of these and other objects are accomplished by a method of forming an image sensor device, comprising the steps of providing a substrate having at least one shallow trench isolation structure therein; forming at least one photosensor and at least one light emitting element in the substrate, wherein the photosensor and the light emitting element are isolated by the shallow trench isolation structure; removing a portion of the shallow trench isolation structure to form an opening therein, wherein a bottom of the opening exposes a portion of the substrate; and filling an opaque material in the opening to form an optical guard ring between the photosensor and the light emitting element.

One or more of these and other objects are accomplished by a method of forming an image sensor device, comprising the steps of providing a substrate having at least one shallow trench isolation structure therein; forming at least one photosensor and at least one light emitting element in the substrate, wherein the photosensor and the light emitting element are isolated by the shallow trench isolation structure; removing a portion of the shallow trench isolation structure to form a first opening therein, wherein a bottom of the first opening exposes a portion of the substrate; forming a conformal etching stop layer on the photosensor, a surface of the opening and the light emitting element; forming an interlevel dielectric (ILD) layer on the etching stop layer and filling out the first opening; removing part of the ILD layer and the etching stop layer to form a second opening and at least one third opening therein, wherein the second opening exposes a portion of the substrate in the first opening and the third opening exposes a portion of the light emitting element; and filling an opaque metal in the second and third openings to form a metal shield in the shallow trench isolation structure and a metal plug connecting the light emitting element.

One or more of these and other objects are accomplished by an image sensor device, comprising a substrate having at least one shallow trench isolation structure therein; at least one photosensor and at least one light emitting element formed in the substrate, wherein the photosensor and the light emitting element are isolated by the shallow trench isolation structure; an opening formed in the shallow trench isolation structure to expose a portion of the substrate; and an opaque shield formed in the opening to prevent photons from the light emitting element from striking the photosensor.

One or more of these and other objects are accomplished by an image sensor device, comprising a substrate having at least one shallow trench isolation structure therein; at least one photosensor and at least one light emitting element formed in the substrate, wherein the photosensor and the light emitting element are isolated by the shallow trench isolation structure; a first opening being formed in the shallow trench isolation structure to expose a portion of the substrate; a conformal etching stop layer being formed on the photosensor, a surface of the opening and the light emitting element; an interlevel dielectric (ILD) layer being formed on the etching stop layer, wherein the ILD layer fills the first opening; a second opening and at least one third opening being formed in the ILD layer, wherein the second opening exposes a portion of the substrate in the first opening and the third opening exposes a portion of the light emitting element; a metal shield being formed in the second opening; and at least one metal plug being formed in the third opening to connect the light emitting element.

One or more of these and other objects are accomplished by an image sensor device, comprising a substrate having a shallow trench isolation structure therein; an image sensor cell region; a peripheral circuit region; a light emitting diode (LED) region being defined in the substrate, wherein the image sensor cell region, the peripheral circuit region and the LED region are separated from one another by the shallow trench isolation structure; and an optical guard ring being formed in the shallow trench isolation structure among the image sensor cell region, the peripheral circuit region and the LED region.

The present invention improves on the conventional technology in that the image sensor device has an optical guard ring (or metal shield) formed in the STI structure between photosensor and light emitting element. The optical guard ring prevents photons from the light emitting element from striking the photosensor. The optical guard ring can be formed during formation of plugs/interconnections. The optical guard ring of the present invention prevents light (or photon) scattering between photosensor and adjacent light emitting structures, thereby reducing noise and crosstalk and ameliorating the disadvantages of the conventional technology.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

Figure 1A:
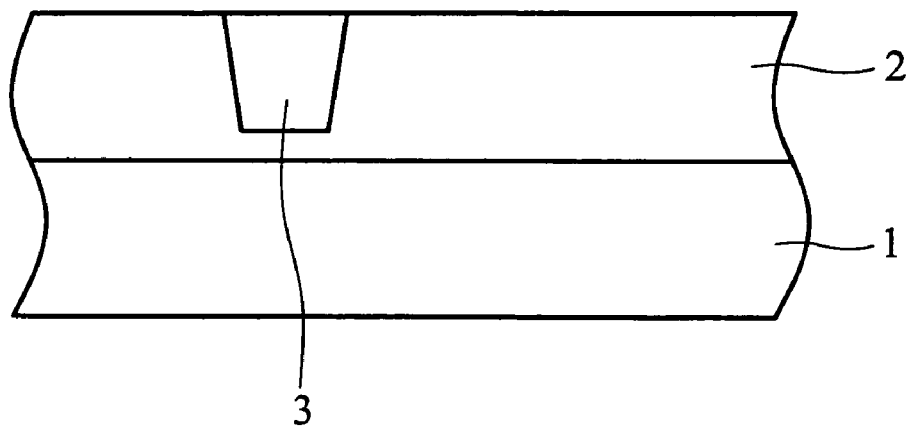
FIGS. 1A-1C are partial sectional views of an image sensor device of the background art showing a method for manufacturing the image sensor device of the background art.
Figure 1B:
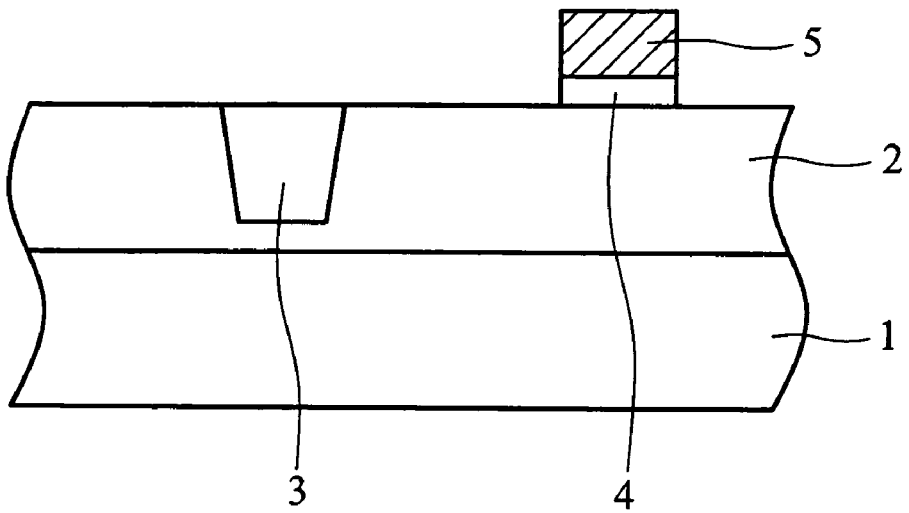
Figure 1C:
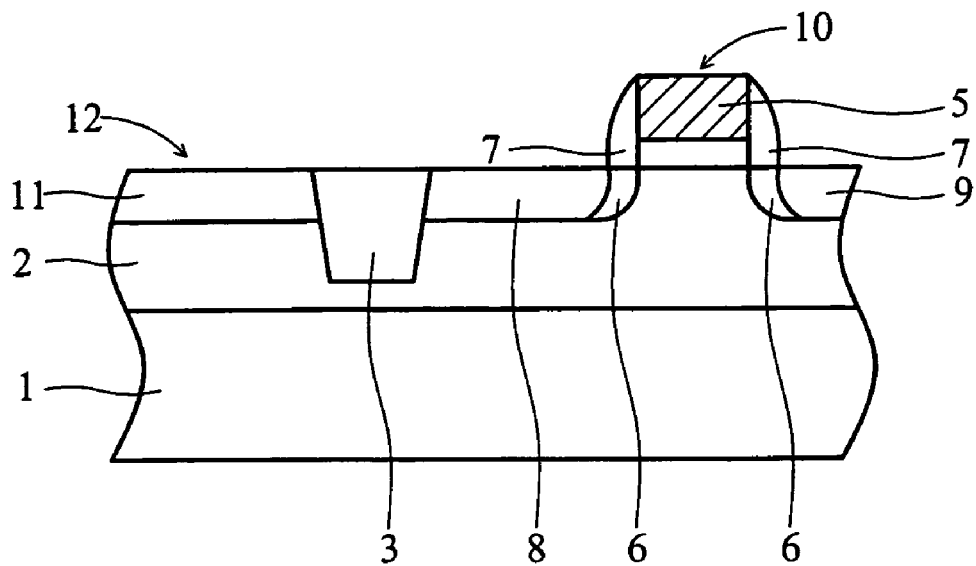
Figure 2:
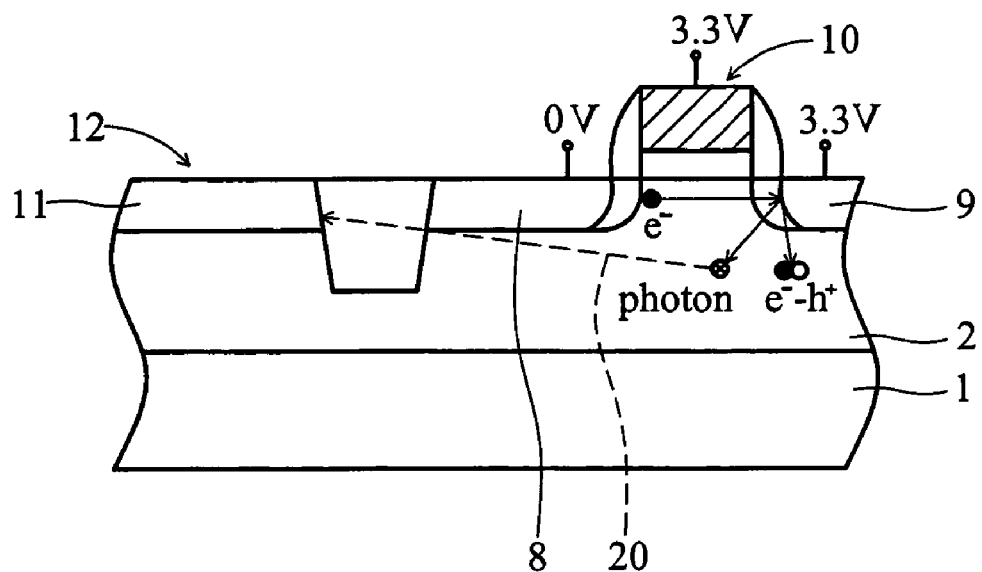
FIG. 2 is a sectional view of an image sensor device of the background art showing the problem of light scattering between photodiode and the adjacent MOS structure.

The present invention will hereinafter be described with reference to the accompanying drawings. FIGS. 3A-3H are sectional views of a modified image sensor device according to an embodiment of the present invention and showing a method of manufacturing the modified image sensor device. FIGS. 4A-4E are sectional views of an image sensor device according to an embodiment of the present invention and showing a method of manufacturing the image sensor device integrated with an LED of the present invention. FIG. 5 is a plan view of an image sensor device integrated with an LED of the present invention.

Reference will now be made in detail to the present preferred embodiments, examples of which are illustrated in the accompanying drawings. Wherever possible, the same reference numbers are used in the drawings and the description to refer to the same or like parts. The present invention provides an image sensor device and fabrication method thereof. The image sensor device is well suited to use with a solid state image sensor, such as a CMOS (complementary metal-oxide semiconductor) imager or an advanced imager integrated with LED (light emitting diode). In order to simplify the illustration, a representative photodiode element serving as a photosensor is illustrated in the preferred embodiments of the present invention. However, one of skill in the art will appreciate that the present invention may be further applied to any form of image sensor with an STI (shallow trench isolation) process.

First Embodiment

Figure 3A:
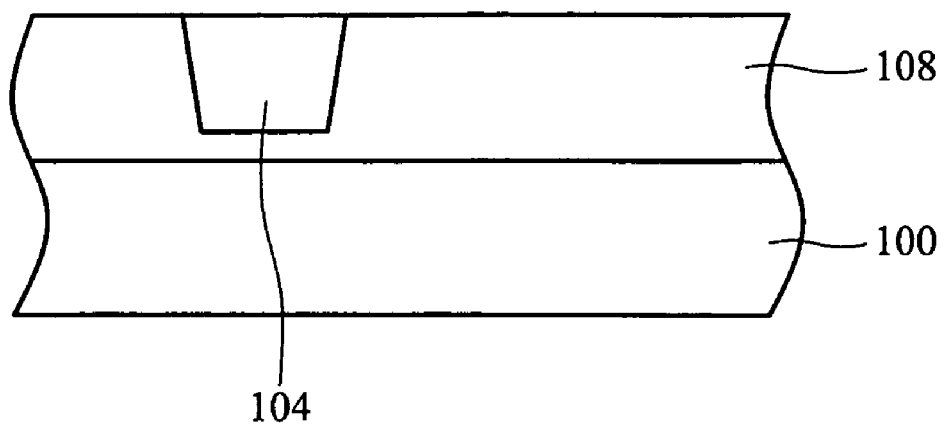
FIGS. 3A-3H are sectional views of a modified image sensor device according to an embodiment of the present invention and showing a method of manufacturing the modified image sensor device.
Figure 3B:
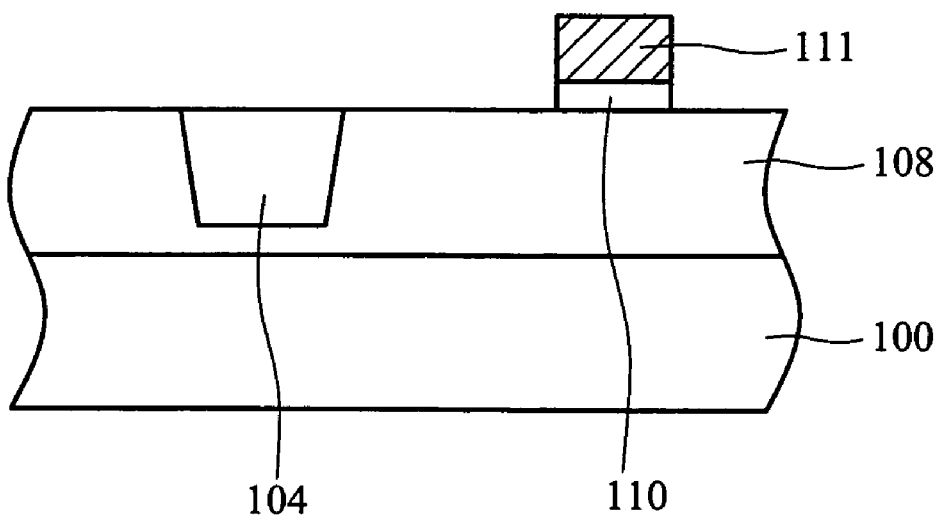
Figure 3C:
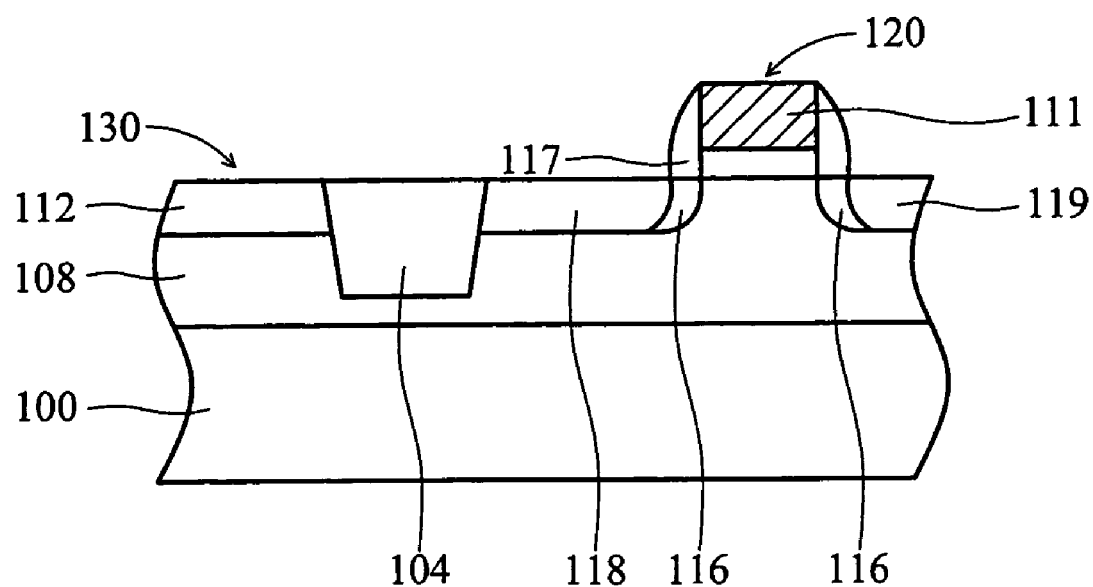
Figure 3D:
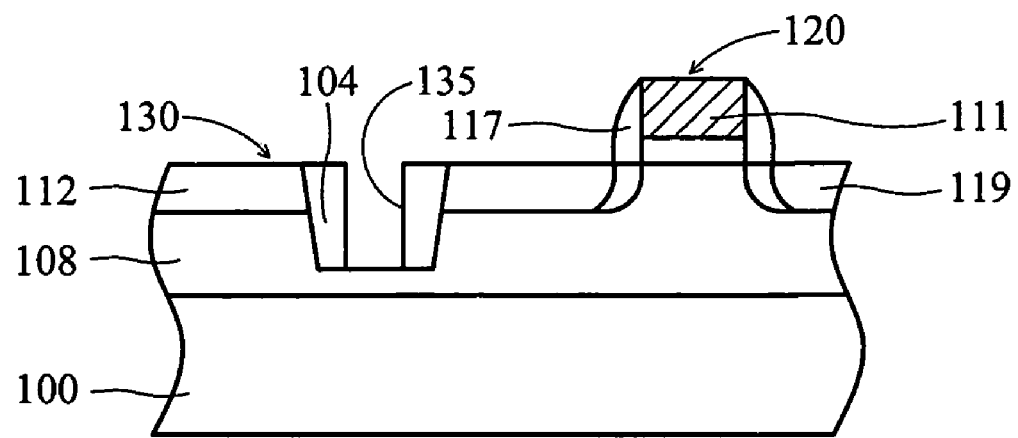
Figure 3E:
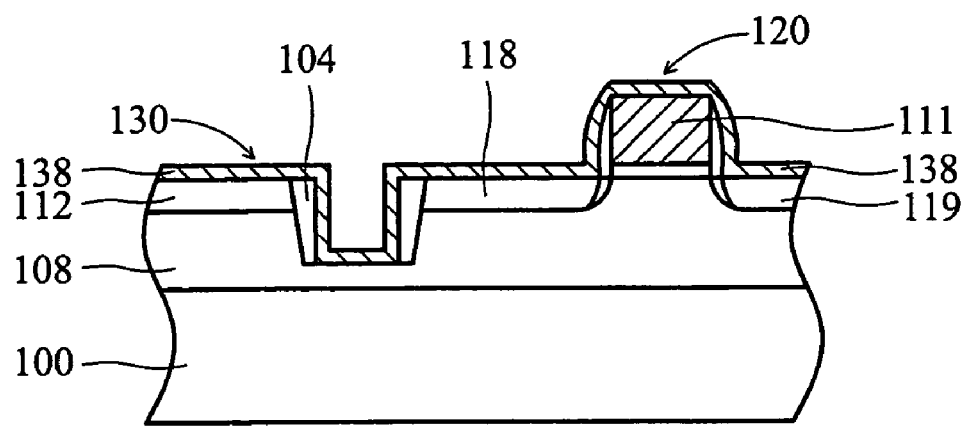
Figure 3F:
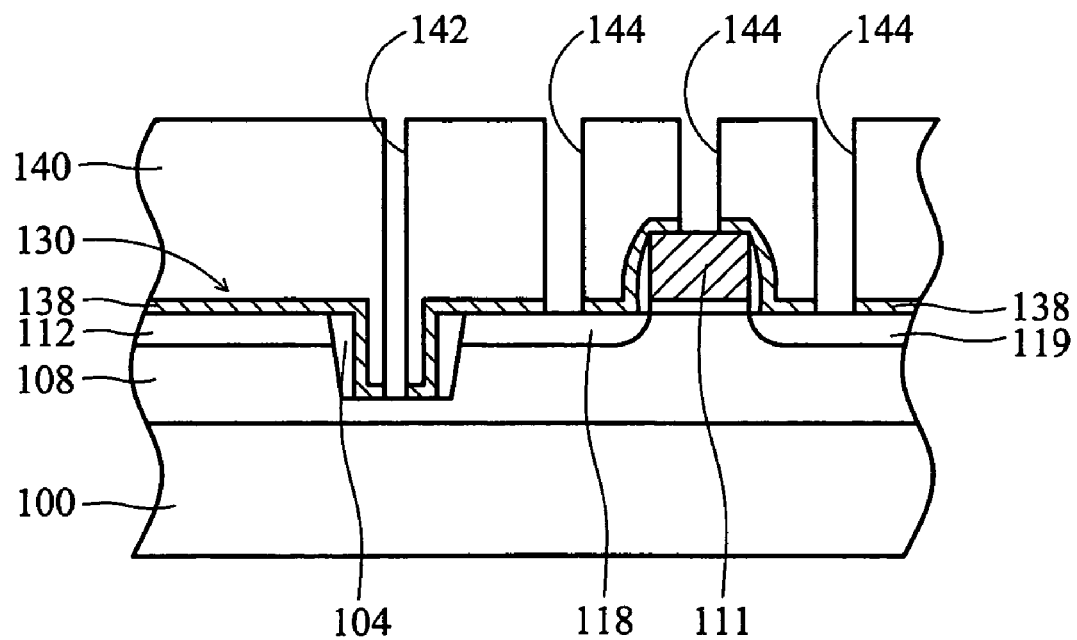
Figure 3G:
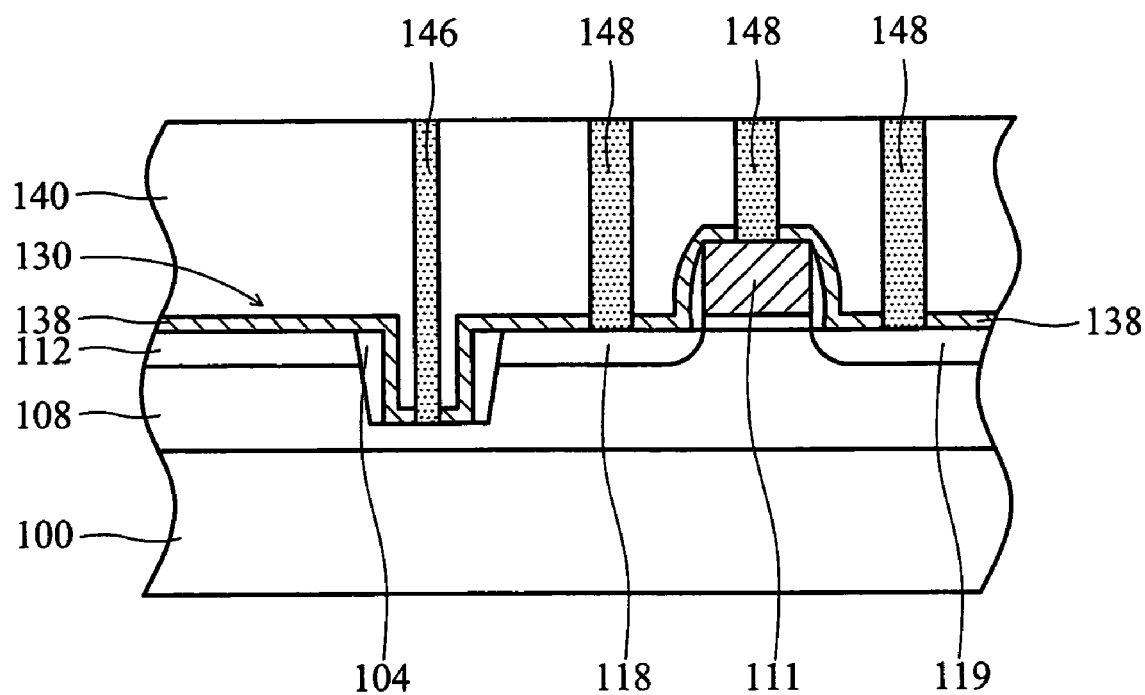
Figure 3H:
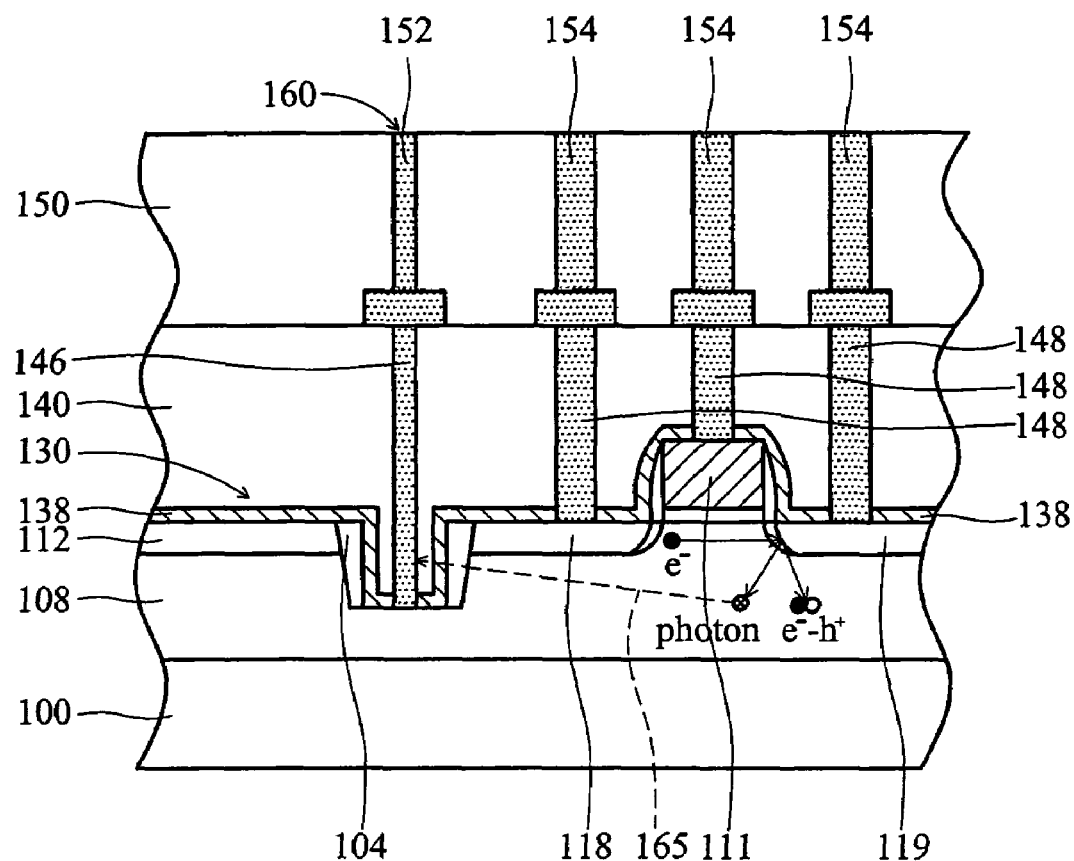

FIGS. 3A-3H are sectional views of a modified image sensor device according to an embodiment of the present invention and showing a method of manufacturing the modified image sensor device. FIG. 3H also illustrates the improved performance of the preferred embodiment of the present invention. It is noted that the first embodiment of the present invention describes the method of forming a single photodiode of a CMOS imager sensor, but is intended to be representative of all the other photodiodes on the same CMOS image sensor.

In FIG. 3A, a semiconductor substrate 100 is provided. The semiconductor substrate 100 may be a monocrystalline silicon substrate or a p-type substrate comprising single crystalline silicon with a <100> crystallographic orientation. A shallow trench isolation (STI) structure 104 consisting of insulating material, e.g., such as $SiO_2$, is formed in the substrate 100 by known isolation techniques. A relevant process for forming the shallow trench isolation structure 104 of the present invention is described in greater detail in U.S. Pat. No. 6,372,603, the entirety of which is hereby incorporated by reference, and is therefore not discussed in greater detail hereinafter to avoid obscuring aspects of the present invention. A p-well region 108 (serving as a diode well) is next formed in a top portion of the substrate 100 and in the pixel/sensor region (not symbolized), via implantation of boron or $BF_2$ ions, e.g., at energy between about 140 and 250 KeV, and at a dose between about 2.5E12 and 3.0E13 atoms/cm$^2$.

In FIG. 3B, the formation of polysilicon gate structure for the image sensor cell or the logic circuit is shown. A gate insulating layer 110, e.g., comprised of $SiO_2$, is thermally grown to a thickness between about 40 and 50 Å. A polysilicon layer (not shown) is next deposited by CVD (chemical vapor deposition) to a thickness of about 1500 and 3000 Å. The polysilicon layer can be doped in situ, during deposition, via addition of arsine or phosphine to a silane ambient, or deposited intrinsically then doped via implantation of arsenic or phosphorous ions. Conventional photolithographic and reactive ion etching (RIE) procedures, using $Cl_2$ or $SF_6$ as an etchant, are used to etch polysilicon, defining a polysilicon gate structure 111.

In FIG. 3C, n-type lightly doped drain (LDD) regions 116 are formed in areas of p-well region 108 not covered by the gate structure 111. The formation of the LDD regions 116 employs implantation of arsenic or phosphorous ions, e.g., at energy between about 35 and 50 KeV, and at a dose between about 1E14 and 6E15 atoms/cm$^2$. A SiN or SiON layer (not shown) with a thickness of about 800 and 2000 Å is next deposited by CVD, followed by anisotropic RIE using $CF_4$ as an etchant. Thus, spacers 117 are formed on the sides of the gate structure 111.

Using the spacers 117 and the gate structure 111 as a mask, n-type heavily doped source/drain regions 118 and 119 are then formed in areas of p-well region 108 by another ion implantation. This implantation uses arsenic or phosphorous ions, for example, at energy between about 35 and 50 KeV, at a dose between about 1E14 and 6E15 atoms/cm$^2$. An NMOS element 120 functioning as a transistor in image sensor region or logic circuit region is thus obtained. This ion implantation procedure also results in the formation of photodiode element 130 in image sensor cell region. The photodiode element 130 consists of an n-type heavily doped region 112 (also referred to as a sensing region) in the p-well region 108. Moreover, a salicide layer (not shown) can be formed on the top surface of the gate structure 111 by known metal silicide techniques.

The silicide process is described in, for example, U.S. Pat. No. 6,194,258, the entirety of which is hereby incorporated by reference, and is therefore not discussed herein to avoid obscuring aspects of the present invention. It is noted that the depth of the shallow trench isolation structure 104 is greater than a depth of the n-type heavily doped region 112. For example, the depth of the shallow trench isolation structure 104 can be between about 8000 and 10000 Å and the depth of the n-type heavily doped region 112 between about 3000 and 5000 Å. This is schematically shown in FIG. 3C.

In FIG. 3D, a portion of the STI structure 104 is removed by conventional photolithography and RIE to form a first opening 135 therein. The bottom of the first opening 135 exposes a portion of the substrate 100 (or the p-well region 108 of the substrate 100).

In FIG. 3E, a conformal etching stop layer 138, such as SiN or SiON, is formed on the photodiode element 130, the interior surface of the opening 135 and the NMOS element 120. The etching stop layer 138 can be deposited by CVD to a thickness between 300 and 500 Å.

In FIG. 3F, an interlevel dielectric (ILD) layer 140, such as $SiO_2$ or BPSG (borophosphosilicate glass), is formed on the etching stop layer 138 to fill the first opening 135. The ILD layer 140 can be deposited by CVD to a thickness between about 8000 and 13000 Å. Chemical mechanical polishing (CMP) planarizes the surface, creating smooth topography for the ILD layer 140.

Conventional photography and RIE are used to remove a portion of the ILD layer 140 and the etching stop layer 138 to form a second opening 142 and a plurality of third openings 144 therein. Definition of the second opening 142 and the third openings 144 can be performed in the same step using one reticle. The second opening 142 exposes part of the substrate 100 in the first opening 135 and the third openings 144 expose part of the NMOS element 120. This is schematically shown in FIG. 3F.

After removal of the photoresist shape (not shown) defining the openings 142 and 144, plasma oxygen ashing and precise wet cleaning are performed. The second and third openings 142 and 144 are then filled with an opaque metal to form a metal shield 146 in the shallow trench isolation structure 104 and metal plugs 148 connecting the NMOS element 120. The opaque metal can be tungsten (W), aluminum (Al) or copper (Cu) or any other metal compatible with semiconductor process. The metal shield 146 and the metal plugs 148 can be deposited by sputtering or plasma vapor deposition to completely fill the second and third openings 142 and 144. Removal of undesired metal, from the top surface of the ILD layer 140, is accomplished using either CMP or selective RIE using $Cl_2$ or $SF_6$ as an etchant. The result of these procedures is schematically shown in FIG. 3G. It is noted that the metal shield 146 eliminates light scattering between the NMOS element 120 and the photodiode element 130.

In FIG. 3H, at least one intermetal dielectric (IMD) layer 150, such as a low-k dielectric layer, is formed on the ILD layer 140. The low-k dielectric material can be SOG (spin on glass), FSG (fluorinated silica glass) or HSQ (hydrogensilsequioxane). The IMD layer 150 can be deposited by CVD to a thickness between about 8000 and 13000 Å. Chemical mechanical polishing (CMP) planarizes the surface, creating smooth topography for the IMD layer 150. It should be noted that the IMD layer 150 can include multiple levels. For example, if the device is fabricated using three metal level processes, then a separate IMD layer 150 exists for each of the three metal levels (not shown). In order to simplify the illustration of the present invention, only one IMD layer 150 is shown in FIG. 3H, but is not intended to limit the present invention.

An interconnection procedure then forms a first interconnection 152 and a plurality of second interconnections 154 in the IMD layer 150. The first interconnection 152 connects the metal shield 146, such that an optical guard ring 160 is formed to prevent photon emission 165 from the NMOS element 120 from striking the photodiode element 130. The second interconnections 154 electrically connect the metal plugs 148. The first and second interconnections 152 and 154 are tungsten (W), aluminum (Al) or copper (Cu) or any other metal compatible with semiconductor process. This is schematically shown in FIG. 3H.

Second Embodiment

Figure 4A:
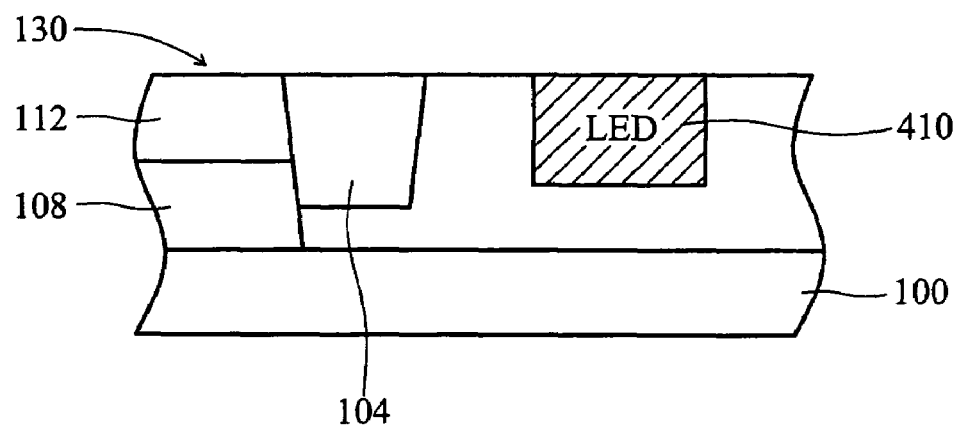
FIGS. 4A-4E are sectional views of an image sensor device according to an embodiment of the present invention and showing a method of manufacturing the image sensor device integrated with an LED of the present invention.

FIGS. 4A-4E are sectional views of an image sensor device according to an embodiment of the present invention and showing a method of manufacturing the image sensor device integrated with an LED of the present invention. In FIG. 4A, a semiconductor substrate 100 is provided. The semiconductor substrate 100 may be a monocrystalline silicon substrate or a p-type substrate comprised of single crystalline silicon with a <100> crystallographic orientation. A shallow trench isolation (STI) structure 104 consisting of insulating material, e.g., such as $SiO_2$, is formed in the substrate 100 by known isolation techniques. Formation of the shallow trench isolation structure 104 is described in, for example, U.S. Pat. No. 6,372,603, the entirety of which is hereby incorporated by reference, and is therefore not discussed herein to avoid obscuring aspects of the present invention. A p-well region 108 (serving as a diode well) is next formed in a top portion of the substrate 100 and in the pixel/sensor region (not symbolized), via implantation of boron or $BF_2$ ions, e.g., at energy between about 140 and 250 KeV, and at a dose between about 2.5E12 and 3.0E13 atoms/$cm^2$.

An n-type heavily doped region 112 (or referred to as a sensing region) is then formed in areas of p-well region 108 by another ion implantation. This implantation uses arsenic or phosphorous ions, for example, at energy between about 35 and 50 KeV, at a dose between about 1E14 and 6E15 atoms/$cm^2$. This ion implantation procedure results in the formation of photodiode element 130 in image sensor cell region. The photodiode element 130 consists of the n-type heavily doped region 112 in the p-well region 108.

A light emitting element 410, such as an LED (light emitting diode) chip, is formed or mounted in the substrate 100. A typical LED chip includes an epitaxial light emission structure. The relevant formation of the LED chip is described in greater detail in U.S. Pat. No. 6,642,547, the entirety of which is hereby incorporated by reference, and is therefore not discussed in greater detail hereinafter to avoid obscuring aspects of the present invention.

Figure 4B:
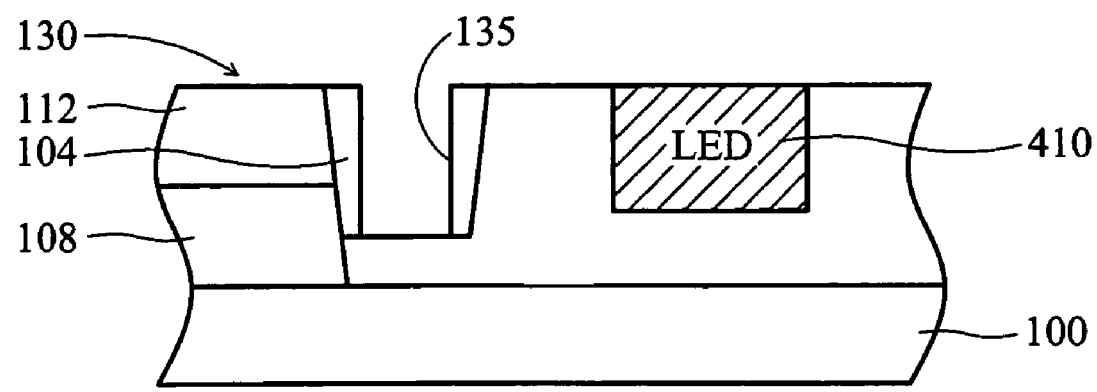
Figure 4C:
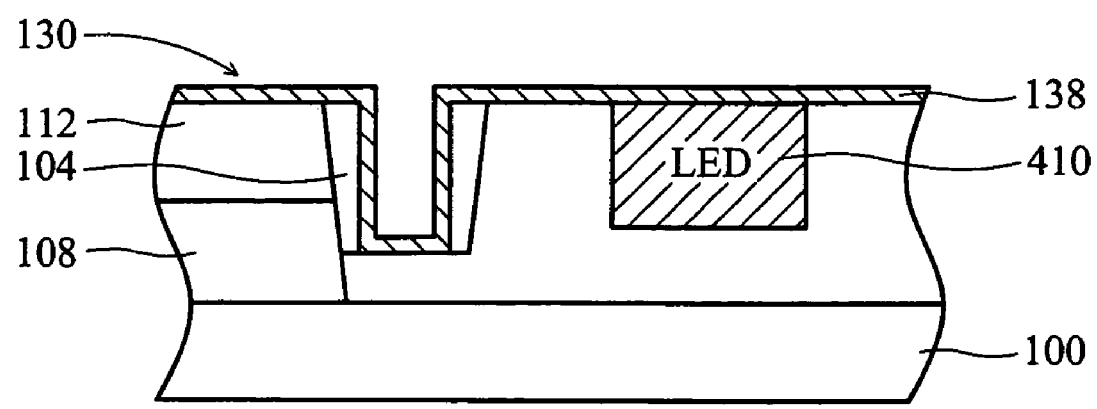
Figure 5:
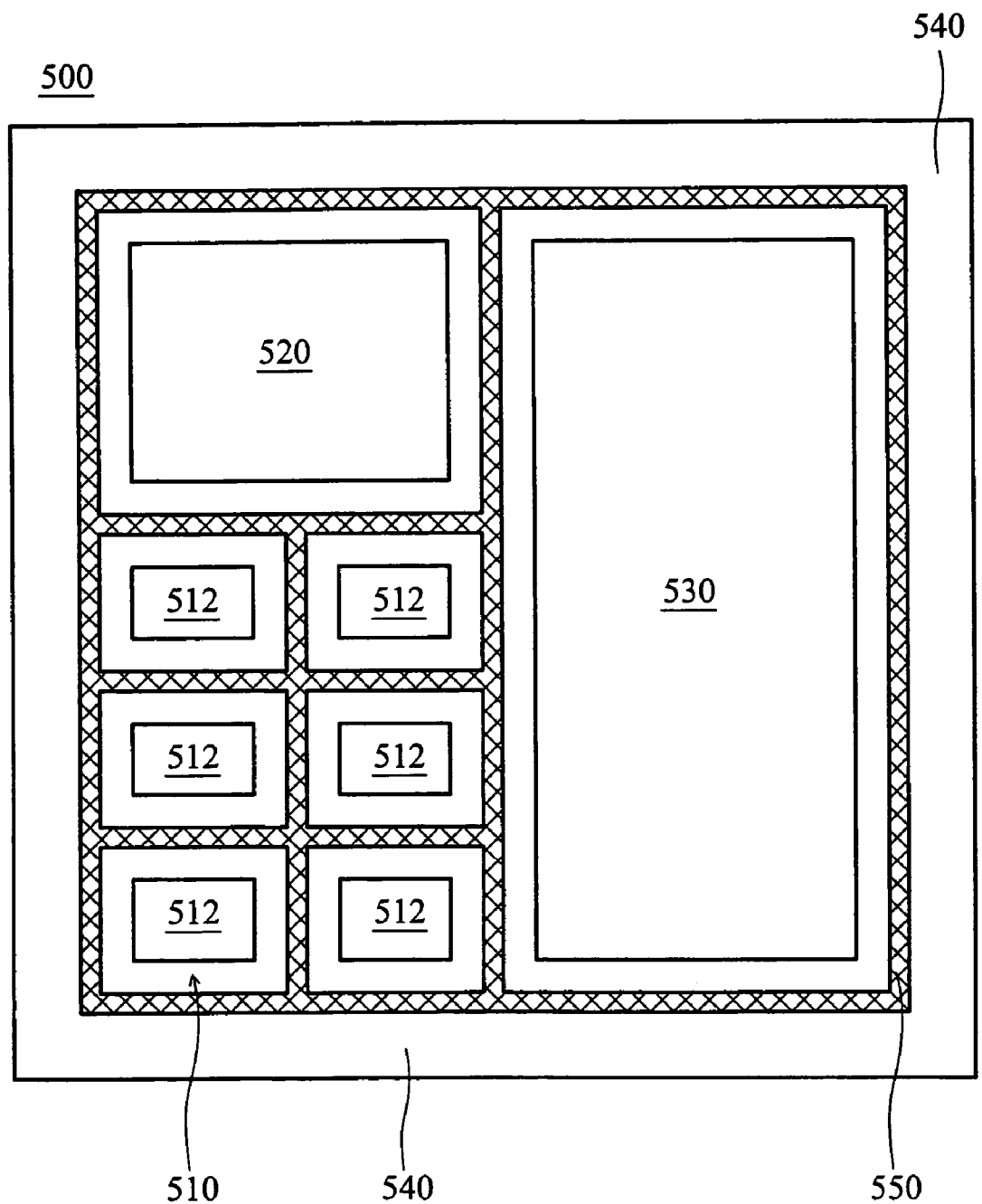
FIG. 5 is a plan view of an image sensor device integrated with an LED of the present invention.

In FIG. 4B, a portion of the STI structure 104 is removed by conventional photolithography and RIE to form a first opening 135 therein. The bottom of the first opening 135 exposes a portion of the substrate 100. In FIG. 4C, a conformal etching stop layer 138, such as SiN or SiON, is formed on the photodiode element 130, the interior surface of the opening 135 and the LED chip 410. The etching stop layer 138 can be deposited by CVD to a thickness between 300 and 500 Å.

Figure 4D:
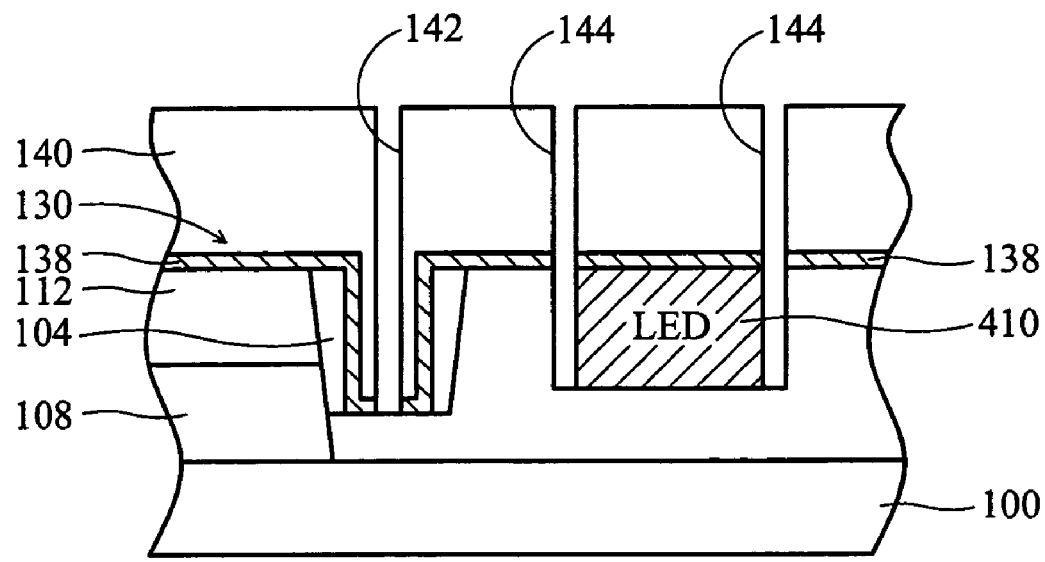

In FIG. 4D, an interlevel dielectric (ILD) layer 140, such as $SiO_2$ or BPSG (borophosphosilicate glass), is formed on the etching stop layer 138 to fill the first opening 135. The ILD layer 140 can be deposited by CVD to a thickness between about 8000 and 13000 Å. Chemical mechanical polishing (CMP) planarizes the surface, creating smooth topography for the ILD layer 140.

Conventional photography and RIE are used to remove a portion of the ILD layer 140 and the etching stop layer 138 to form a second opening 142 and at least one third opening 144 therein. Definition of the second opening 142 and the third opening 144 can be performed in the same step using one reticle. The second opening 142 exposes part of the substrate 100 in the first opening 135 and the third opening 144 exposes part of the LED chip 410. This is schematically shown in FIG. 4D.

Figure 4E:
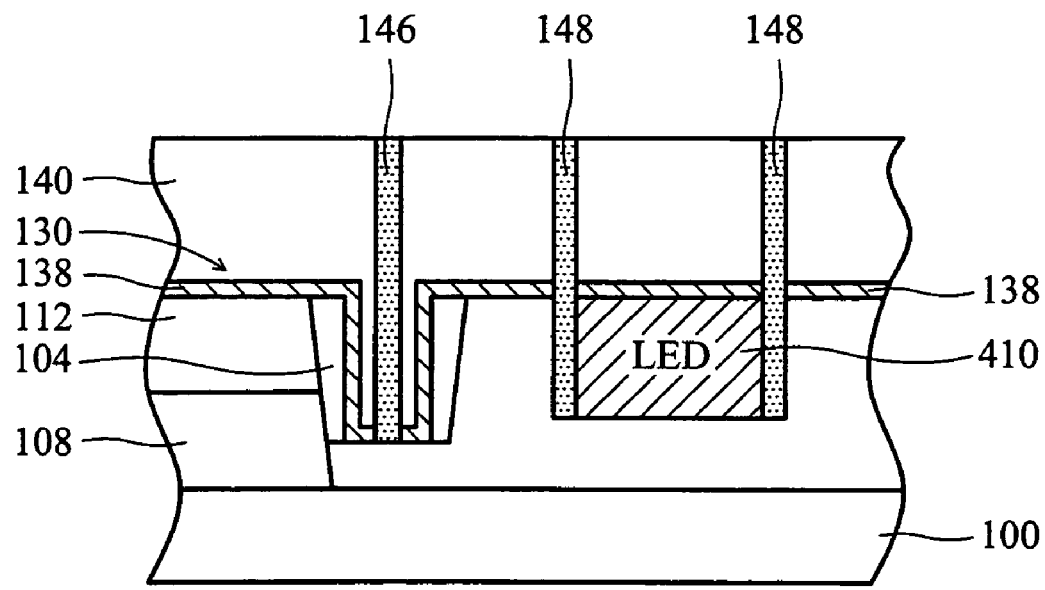

After removal of the photoresist shape (not shown) defining the openings 142 and 144, plasma oxygen ashing and precise wet cleaning are performed. The second and third openings 142 and 144 are then filled with an opaque metal to form a metal shield 146 in the shallow trench isolation structure 104 and at least one metal plug 148 connecting the LED chip 410. The opaque metal can be tungsten (W), aluminum (Al) or copper (Cu) or any other metal compatible with semiconductor process. The metal shield 146 and the metal plug 148 can be deposited by sputtering or plasma vapor deposition procedures to completely fill the second and third openings 142 and 144. Removal of undesired metal from the top surface of the ILD layer 140 is accomplished using either CMP or selective RIE using $Cl_2$ or $SF_6$ as an etchant. The result of these procedures is schematically shown in FIG. 4E. It is noted that the metal shield 146 can prevent photons 415 from the LED chip 410 from striking the photodiode element 130. Moreover, the metal plug 148 is preferably located on both sides of the LED chip 410 to prevent the light from the LED chip 410 from striking the photodiode element 130 more efficiently.

Moreover, formation of intermetal dielectric (IMD) layer and the interconnection procedure can be performed. Since this step is similar to the step shown in FIG. 3H, the detailed steps are not described again.

FIG. 5 is a plan view of an image sensor device integrated with an LED of the present invention. The advanced image sensor device 500 can include an image sensor cell region 510 having an array of photodiodes 512, a peripheral circuit region 520 and an LED region 530 formed in/on a substrate (not shown) in an exemplary embodiment. These regions 510, 520 and 530 are separated/isolated from one another by a shallow trench isolation structure 540 formed in the substrate (not shown). The shallow trench isolation structure 540 consists of $SiO_2$.

According to the present method, a metal shield (also referred to as an optical guard ring) 550 is formed in the shallow trench isolation structure 540 among an image sensor cell region 510, a peripheral circuit region 520 and an LED region 530. Thus, the metal shield (also referred to as an optical guard ring) 550 prevents light scattering among these regions 510, 520 and 530. In addition, the metal shield 550 can be formed around each photodiode 512 to prevent light scattering between photodiode and adjacent light emitting element (e.g. MOS, not shown).

The present invention provides an image sensor with an optical guard ring (or metal shield) and fabrication method thereof. The present invention forms an optical guard ring (or metal shield) in the STI structure between photosensor (i.e. photodiode) and light emitting element (e.g. MOS and LED), preventing photons from the light emitting element from striking the photosensor. The optical guard ring can be simultaneously formed during the steps of forming plugs/interconnections. The optical guard ring of the present invention prevents light (or photon) scattering between photosensor and adjacent light emitting structure, thereby reducing noise and crosstalk and ameliorating the disadvantages of the conventional technology.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming an image sensor device, comprising the steps of:

providing a substrate having at least one shallow trench isolation structure therein;

forming at least one photosensor and at least one light emitting element in the substrate, wherein the photosensor and the light emitting element are isolated by the shallow trench isolation structure;

removing a portion of the shallow trench isolation structure to form an opening therein, wherein a bottom of the opening exposes a portion of the substrate; and filling an opaque material in the opening to form an optical guard ring between the photosensor and the light emitting element.

2. The method according to claim 1, wherein the substrate is a semiconductor substrate.

3. The method according to claim 1, wherein the opaque material is metal.

4. The method according to claim 3, wherein the metal is tungsten (W), aluminum (Al) or copper (Cu).

5. A method of forming an image sensor device, comprising the steps of:

providing a substrate having at least one shallow trench isolation structure therein;

forming at least one photosensor and at least one light emitting element in the substrate, wherein the photosensor and the light emitting element are isolated by the shallow trench isolation structure;

removing a portion of the shallow trench isolation structure to form a first opening therein, wherein a bottom of the first opening exposes a portion of the substrate;

forming a conformal etching stop layer on the photosensor, a surface of the first opening and the light emitting element;

forming an interlevel dielectric (ILD) layer on the etching stop layer and filling out the first opening;

removing a portion of the ILD layer and the etching stop layer to form a second opening and at least one third opening therein, wherein the second opening exposes a portion of the substrate in the first opening and the third opening exposes a portion of the light emitting element; and filling an opaque metal in the second and third openings to form a metal shield in the shallow trench isolation structure and a metal plug connecting the light emitting element.

6. The method according to claim 5, further comprising the steps of:

forming at least one intermetal dielectric (IMD) layer on the ILD layer; and performing an interconnection procedure to form a first interconnection and at least one second interconnection in the IMD layer, wherein the first interconnection connects the metal shield to form an optical guard ring to prevent photons from the light emitting element from striking the photosensor, and the second interconnection electrically connects the metal plug.

7. The method according to claim 5, wherein the substrate is a semiconductor substrate.

8. The method according to claim 5, wherein the etching stop layer is a SiN or SiON layer.

9. The method according to claim 5, wherein the opaque metal is tungsten (W), aluminum (Al) or copper (Cu).

10. The method according to claim 6, wherein the first and second interconnections are tungsten (W), aluminum (Al) or copper (Cu) interconnections.

11. The method according to claim 5, wherein the second opening and the third opening are defined in the same step using one reticle.

* * * * *